United States Patent
Nguyen Van Dau et al.

(10) Patent No.: US 7,459,998 B2
(45) Date of Patent: Dec. 2, 2008

(54) CONTROL DEVICE FOR REVERSING THE DIRECTION OF MAGNETISATION WITHOUT AN EXTERNAL MAGNETIC FIELD

(75) Inventors: Frédéric Nguyen Van Dau, Palaiseau (FR); Vincent Cros, Paris (FR); Jean-Marie George, Bures sur Yvette (FR); Julie Grollier, Paris (FR); Henri Jaffres, Orsay (FR); Frédéric Petroff, Taverny (FR)

(73) Assignee: Thales, Neuilly-sur-Seine (FR)

( * ) Notice: Subject to any disclaimer, the term of this patent is extended or adjusted under 35 U.S.C. 154(b) by 122 days.

(21) Appl. No.: 10/484,381

(22) PCT Filed: Jul. 26, 2002

(86) PCT No.: PCT/FR02/02684

§ 371 (c)(1),
(2), (4) Date: May 25, 2004

(87) PCT Pub. No.: WO03/019568

PCT Pub. Date: Mar. 6, 2003

(65) Prior Publication Data

US 2004/0196744 A1 Oct. 7, 2004

(30) Foreign Application Priority Data

Jul. 27, 2001 (FR) .................................. 01 10126

(51) Int. Cl.
*H01F 7/02* (2006.01)
(52) U.S. Cl. .................. 335/302; 335/306; 365/158
(58) Field of Classification Search ......... 335/302–306, 335/205–206; 365/158
See application file for complete search history.

(56) References Cited

U.S. PATENT DOCUMENTS

| 5,541,868 | A | | 7/1996 | Prinz |
| 5,661,062 | A | | 8/1997 | Prinz |
| 5,686,879 | A | | 11/1997 | Schuhl et al. |
| 5,695,864 | A | | 12/1997 | Slonczewski |
| 5,715,121 | A | * | 2/1998 | Sakakima et al. ......... 360/324.2 |
| 6,111,784 | A | * | 8/2000 | Nishimura .................. 365/173 |
| 6,191,581 | B1 | | 2/2001 | Van Dau et al. |
| 6,291,993 | B1 | | 9/2001 | Fert et al. |
| 6,496,004 | B1 | | 12/2002 | Nguyen Van Dau et al. |
| 6,990,013 | B2 | * | 1/2006 | Sato et al. .................... 365/158 |
| 2002/0118494 | A1 | * | 8/2002 | Hayashi .................... 360/324.2 |
| 2006/0092685 | A1 | * | 5/2006 | Ootsuka et al. ............. 365/145 |
| 2006/0222835 | A1 | * | 10/2006 | Kudo et al. ................. 428/212 |

FOREIGN PATENT DOCUMENTS

EP 1 096 500 5/2001

* cited by examiner

*Primary Examiner*—Anh Mai
*Assistant Examiner*—Bernard Rojas
(74) *Attorney, Agent, or Firm*—Lowe Hauptman Ham & Berner, LLP

(57) ABSTRACT

The disclosure relates to a device for controlling magnetization reversal in a controlled ferromagnetic system such as a magnetic memory element, without using an external magnetic field, wherein it comprises between two flat electrodes a magnetic control part comprising, starting from the first electrode, a first ferromagnetic layer, a non-magnetic layer, and a second ferromagnetic layer, and the second of said two flat electrodes, the thickness of said second ferromagnetic layer being less than that of said first layer, and the thickness of said second electrode being sufficiently small to enable magnetic coupling between said second ferromagnetic layer and the system controlled by the control device.

15 Claims, 2 Drawing Sheets

CONTROL DEVICE FOR REVERSING THE DIRECTION OF MAGNETISATION WITHOUT AN EXTERNAL MAGNETIC FIELD

BACKGROUND OF THE INVENTION

The invention relates to a device for controlling the reversal of the magnetization direction without use of an external magnetic field.

The U.S. Pat. No. 5,695,864 patent describes an electronic component with five layers, some of them magnetic, others not, enabling magnetic switching, in other words writing of magnetic memory elements. This electronic component exploits a phenomenon that makes it possible to induce a magnetization reversal of a ferromagnetic film by applying an electrical spin-polarized current, without having to apply an external magnetic field to the magnetic elements.

DESCRIPTION OF THE PRIOR ART

The use of devices such as so-called Magnetic Random Access Memories (MRAM) necessitates a local magnetic control to perform their magnetic switching (writing or re-writing of the memory). At present, to perform this switching, the magnetic field produced by an electrical current applied to a conductive blade (called a "word line") in direct contact with the magnetic elements is used. However, in the race to miniaturization, this solution is unable to provide a sufficiently intense magnetic field to ensure the switching, since either the size of the "word line" or the current density applied to them would be too large, and an excessive current could destroy these elements. To overcome this, we could try to implement the device described in the abovementioned US patent. However, such a device would be difficult to make, in particular due to the fact that the evacuation of the control current, which is necessarily high, reduces the efficiency of the magnetic control.

SUMMARY OF THE INVENTION

The present invention proposes a device for controlling magnetization reversal without use of an external magnetic field. Moreover the device can be miniaturized (to sub-micron dimensions), it is highly efficient, and presents no risk of damage to the elements it controls.

To this end, the invention is a device for controlling magnetization reversal without using an external magnetic field, wherein it comprises between two flat electrodes a magnetic control part comprising, starting from the first electrode, a first ferromagnetic layer, a non-magnetic layer, and a second ferromagnetic layer, and a second electrode, the thickness of said second ferromagnetic layer being less than that of said first layer, and the thickness of said second electrode being sufficiently small to enable magnetic coupling between said second ferromagnetic layer and the system controlled by the control device.

BRIEF DESCRIPTION OF THE DRAWINGS

The invention will be better understood on reading the following detailed description of two embodiments, which are non-limitative and taken only as examples, with reference to the attached drawings of which.

DETAILED DESCRIPTION OF THE INVENTION

The invention is described below with reference to the control of a magnetic memory element for writing (or re-writing) binary information. However the invention is of course not limited to this application, since it can be implemented for the magnetic control of other ferromagnetic devices, by reversing their magnetization direction, for example a set of MRAM elements (controlled by a set of control devices), a magnetic medium in motion relative to a control device and on which the device reverses specific magnetic points, etc.

Figure 1:
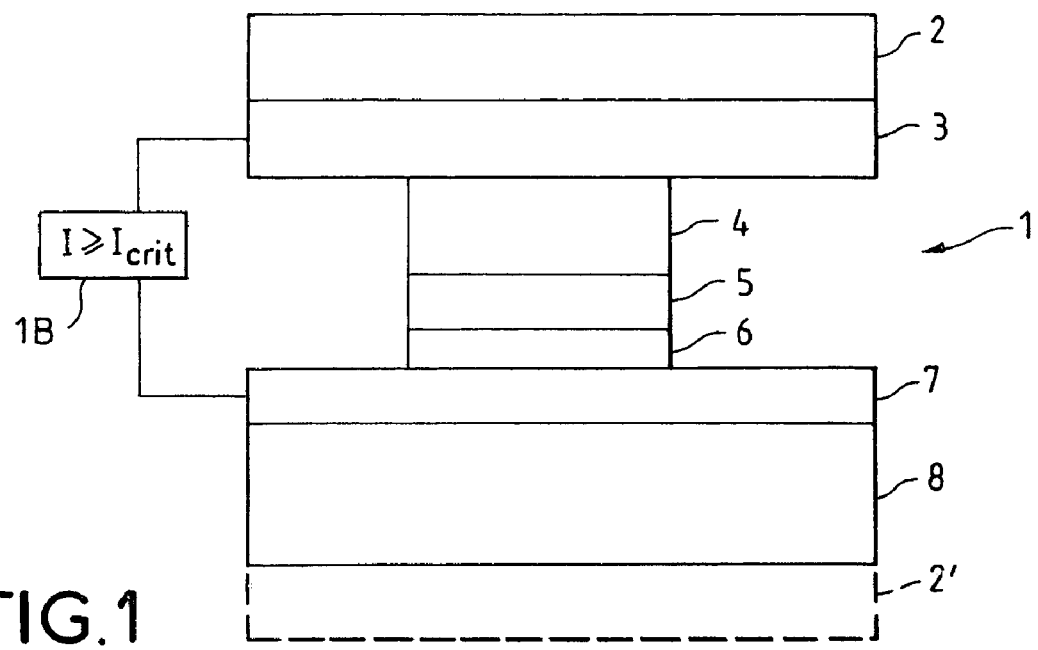
FIG. 1 is a schematic sectional diagram of a first embodiment of the control device according to the invention.

The control device 1 shown schematically in FIG. 1 includes several layers formed successively on a substrate 2, for example of silicon. These layers are, in order: a first electrode 3, a first ferromagnetic layer 4, a non-magnetic conductive layer 5, a second ferromagnetic layer 6 and an electrode 7. The device 8 being controlled is in contact with the electrode 7 (or, in a variant, at a very small distance from it), such that the sum of the thicknesses of the electrode 7 (and the possible air gap between this electrode) and the device 8 is less than a predefined value E corresponding to the limiting distance between the layer 6 and the device 8, value beyond which the control device can no longer induce magnetization reversal in the device 8.

A control current Ic, greater than or equal to a value $I_{crit}$ (critical value above which the magnetic reversal of the device 8 is induced) is supplied by a current source 1B.

In a typical embodiment, the electrodes 3 and 7 are made from a material of very high electrical conductivity such as Au, Cu or Al. The thickness of the electrode 3 is not critical, it can be a value typical of the conductive electrodes in similar devices. In one embodiment it is about 1,000 Å. The thickness of the electrode 7 is between 5 Å and about 10,000 Å depending on the mechanism used for magnetic coupling with the device 8. The ferromagnetic layer 4 is of a material with good ferromagnetic qualities, such as Fe, Co, Ni or an alloy of these elements, or even a semi-metallic material (magnetic oxide, Heussler alloy, etc.). The thickness of this layer 4 is, in one embodiment, between a few tens and a few hundreds of nanometers, depending on its composition. The layer 5 is of conductive non-ferromagnetic material, and is a few nanometers thick. The layer 6 has the same ferromagnetic composition as the layer 4, but it is thinner than layer 4. For example its thickness is a few tens of percent of the thickness of the layer 4.

The control device described above operates as follows. According to the above-mentioned US patent, a device is known for controlling magnetization reversal in a MRAM memory, suffering the shortcomings mentioned earlier. The control device of the present invention enables, thanks to its architecture, and in particular thanks to the arrangement of the second electrode 7, decoupling of the writing part of the device 8 (which is in this case a MRAM memory) from the reading part, as explained below.

There are currently two theories explaining the phenomenon of magnetization reversal (in other words 180° rotation of the magnetization direction) by injection of a spin-polarized current. The first, proposed by J. Slonczewski in the above-mentioned US patent, is based on the principle of conservation of kinetic moment associated with the magnetic moment. This is based on a trilayer magnetic system comprising a non-ferromagnetic layer between two ferromagnetic layers. The injection of a current from the first ferromagnetic layer in the non-ferromagnetic layer produces a spin-polarized current with which a magnetic moment flux S can be associated. For a high-density current, the relaxation of the transversal component of the magnetic moment transported by the flux S induces a torque on the magnet moments in layer 6. In certain cases (current exceeding a critical value), this torque can induce the reversal of the magnetization of the second ferromagnetic layer.

According to the second theory, the injection of a spin-polarized current produces spin cumulation effects at the interfaces of the non-ferromagnetic layer. These effects are known to underlie perpendicular giant magnetoresistance (GMR) (see for example the article by T. Valet and A. Fert in Physical Review, B, 48, 7099 of 1993). The amplitude of the magnetic moment induced by the cumulation of spin depends on the balance between injection and spin relaxation (return to the minimal energy state of the system) and also of the orientation relative of the magnetizations of the two ferromagnetic layers. We can show that for sufficiently high current densities, the most favorable energy state of the system is that for which the magnetization of the second ferromagnetic layer is inversed in order to obtain a magnetic configuration relative of the two ferromagnetic layers which is the inverse of that existing at low current.

Whatever the exact theoretical explanation, two important conclusions are:

a) the current density traversing the trilayer system, necessary to reverse the magnetization in the second ferromagnetic layer, is in the present state of the art about $10^{11}$ A/m$^2$. This value is high compared with those used in common spin electronic devices and requires that the systems in question be entirely metallic and of sub-micron size;

b) the best reversal efficiency is obtained when the spin-polarized current is injected perpendicularly to the planes of the layers.

The device according to the invention described above satisfies these two conditions and operates as follows. The ferromagnetic layer 4 enables spin polarization of the current coming from source 1B via the electrode 3 and arriving substantially perpendicularly to the planes of the layers of the device 1. This polarized current traverses the ferromagnetic layer 6 to reach the electrode 7 (still perpendicularly to the planes of the layers) and returns to the source 1B. The reversal of the magnetization of the layer 6 is thus assured when the current density reaches the critical value mentioned above (about $10^{11}$ A/m$^2$). This magnetization reversal enables the device 8 to be controlled. Obviously this process is reversible if the direction of the current is reversed.

Figure 2:
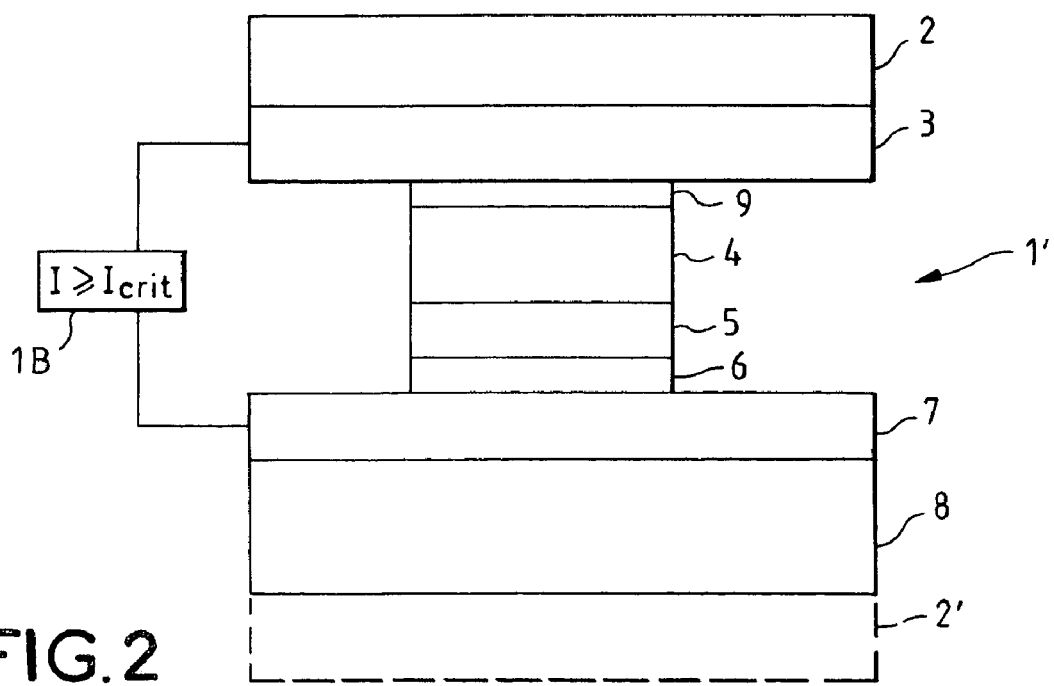
FIG. 2 is a schematic sectional diagram of a second embodiment of the control device according to the invention.

The embodiment 1' in FIG. 2 includes the essential elements of the device 1 in FIG. 1, which are elements 2 to 7 arranged in the same order and which can have the same composition and the same dimensions as in FIG. 1. The difference lies in the fact that an anti-ferromagnetic layer 9 is interposed between the layers 3 and 4. This layer 9 is of IrMn, NiMn, PtMn or FeMn, for example, and is a few nanometers thick. The layer 9 enables the orientation of the magnetization in the layer 4 to be fixed in a known manner, in addition to the possibility provided by the optimization of the parameters of layer 4 (composition and/or thickness).

In the embodiments in FIGS. 1 and 2, the thickness of the layer 5 is chosen such that the spin-polarized current arriving at the layer 6 is optimized and that all the couplings between the layers 4 and 6 are minimized. Of course, in order that the very high current density necessary to reverse the magnetization does not destroy the control device of the invention, the section of the layers 4 to 6 must be of sub-micron size; this section is advantageously less than 0.5 µm$^2$.

Figure 3:
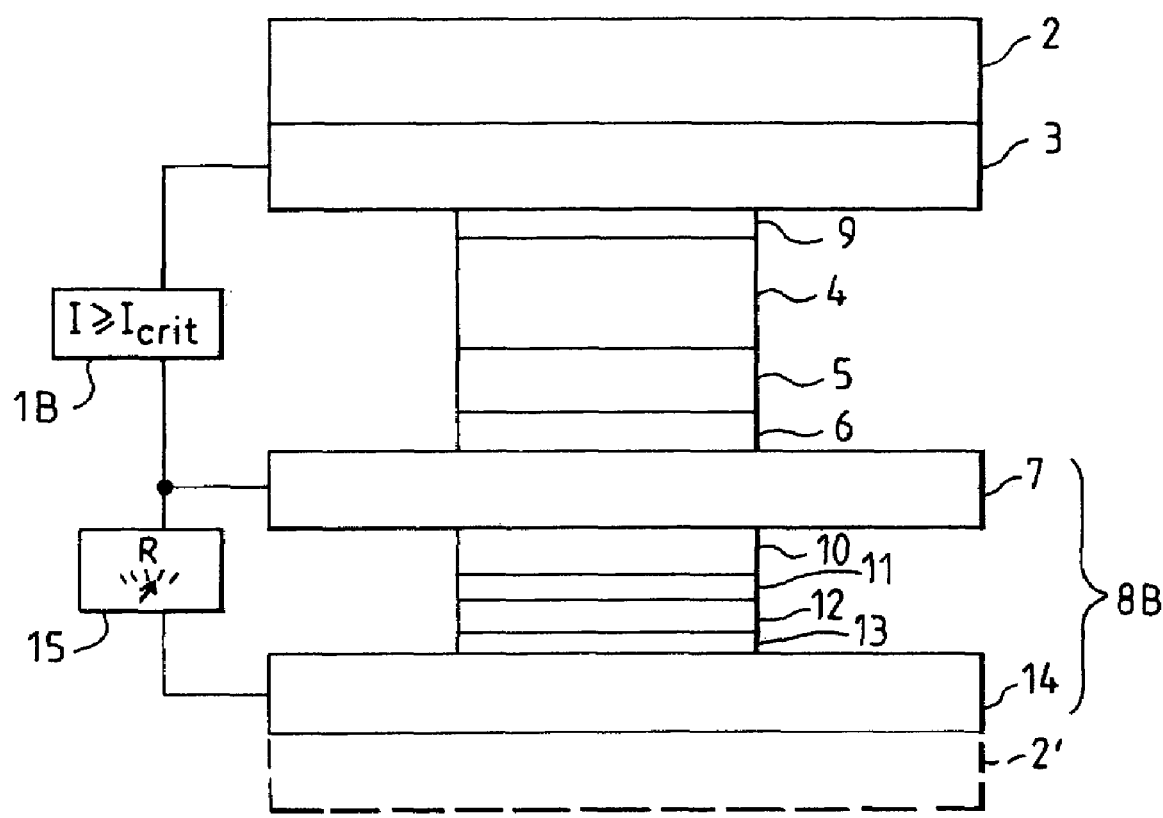
FIG. 3 is a schematic sectional diagram of the control device according to the invention associated with a MRAM magnetic memory element.

FIG. 3 shows the device in FIG. 2 in which the controlled device 8 is an element 8B of MRAM-type magnetic memory. This element 8A includes several layers formed on the electrode 7: in order, these are a ferromagnetic layer 10, a non-magnetic layer 11, a second ferromagnetic layer 12, an anti-ferromagnetic layer 13 and an electrode 14.

The element 8B is made in a known manner. In the case of the present invention the ferromagnetic layers can have the same composition as those of the control device in FIGS. 1 and 2, and the non-magnetic layer 11 can either be of metal commonly used for memories exploiting the giant magnetoresistance (GMR) effect or of insulating or semiconducting material commonly used for memories exploiting the tunnel magnetoresistance (TMR) effect. The layer 13, which is optional, advantageously enables the ferromagnetic layer 12 to be made "hard", thanks to an exchange coupling effect that "holds" the magnetization of layer 12 in a given direction. The electrical resistance state of the memory (high or low, with a difference of about 10% to 50% of resistance value between these two states) is therefore determined only by the orientation of the magnetization in the ferromagnetic layer 10 that is "mobile" relative to that in the "held" layer 12. In order to determine the state of the magnetic memory 8B, we measure the resistance of the layers located between the electrodes 7 and 14 using a suitable resistance measuring device 15 connected across these electrodes, or electrodes 3 and 14.

One important characteristic of the device according to the invention is the presence of the electrode 7 which is formed by a layer of non-magnetic conductive material. First, this layer 7 separates electrically the control device from the device (8, 8A) being controlled and, secondly, it enables evacuation of the intense currents required to flow in the magnetic control device without them passing through the device being controlled (the magnetic memory element). Finally, it enables circulation of the currents in the control device and in the controlled device perpendicularly to the planes of the layers.

Two magnetic coupling process induced by the ferromagnetic layer 6, via the electrode 7, in the ferromagnetic layer to be controlled in the device 8 (layer 10 in the case of the memory element in FIG. 3) enable the magnetic orientation in this layer to be controlled without applying an external magnetic field. The first process is based on the existence of an indirect magnetic exchange coupling between the layer 6 and the layer 10 via the electrode 7. This phenomenon has been widely studied in multilayer magnetic systems. It is known that this exchange coupling persists even for thicknesses of the separating layer (electrode 7 in this case) of up to 100 Å, and that its sign (parallel or antiparallel coupling) depends on the thickness of this separating layer.

A second possible process is dipolar magnetic coupling. In effect, this type of coupling, which persists even for distances (thickness of layer 7 in this case) of a few hundreds of nanometers orients the magnetizations of layers 6 and 10 antiparallel. The reversal of the magnetization direction in the free layer 6 by injection of a spin-polarized current in the control device in turn causes reversal of the magnetization in the "mobile" layer (layer 10 of the memory element). It is therefore possible to control the magnetic state of a memory element and therefore to "write" in this memory element without applying an external magnetic field.

Finally, we note that the value of the critical current above which magnetization reversal occurs in layer 6, and therefore in layer 10, is to a first approximation inversely proportional to the square of the area of this layer. Consequently, the smaller the size of the memory element controlled the higher the efficiency of the control device of the invention. This is the opposite of known devices in which the magnetic control is by means of a magnetic field, itself generated by a current, since the smaller the memory element the higher the current density must be. The invention therefore removes an obstacle to miniaturization of the memory element.

In a variant of the invention, represented by dashed lines in the figures, the substrate (2) instead of supporting the electrode 3 supports the device 8 or 8B (if this device is fixed relative to the control device, which is formed on it). This substrate is then referenced 2'.

What is claimed is:

1. A device for controlling magnetization reversal of a ferromagnetic device without using an external magnetic field, comprising:
    at least two flat electrodes;
    a magnetic control part between said two flat electrodes including, starting from the first electrode, a first ferromagnetic layer, a non-magnetic layer, and a second ferromagnetic layer, and a second electrode, the thickness of said second ferromagnetic layer being less than that of said first layer, and the thickness of said second electrode being sufficiently small to enable magnetic coupling between said second ferromagnetic layer and a controlled ferromagnetic device controlled by the control device wherein said first and second ferromagnetic layer are entirely metallic and electrically conductive.

2. The control device according to claim 1, wherein the thickness of said second electrode, between this electrode and said controlled ferromagnetic system, is between 5 Å and about 10,000 Å.

3. The control device according to claim 1, wherein said first ferromagnetic layer has a thickness between a ten and a few hundred nanometers, and wherein said non-magnetic layer has a thickness of a few nanometers, and wherein said second ferromagnetic layer has a thickness less than that of said first ferromagnetic layer.

4. The control device according to claim 1, further comprising an anti-ferromagnetic layer between said first ferromagnetic layer and said first electrode.

5. The control device according to claim 4, wherein said anti-ferromagnetic layer has a thickness of a few nanometers.

6. The control device according to claim 1, wherein said controlled ferromagnetic system the device controls is a magnetic memory element formed on said second electrode.

7. The control device according to claim 6, wherein said magnetic memory element comprises a first ferromagnetic layer, a non-magnetic layer, a second ferromagnetic layer, and an electrode.

8. The control device according to claim 7, wherein said magnetic memory element comprises an anti-ferromagnetic layer between its second ferromagnetic layer and its electrode.

9. The control device according to claim 1, wherein said system it controls is in motion relative to the control device.

10. The control device of claim 2, wherein a gap is formed between said second electrode and said controlled ferromagnetic system.

11. The control device of claim 1, wherein the system controlled by the control device is not located between the electrodes.

12. The control device of claim 1, wherein the non-magnetic layer is electrically conductive.

13. The control device of claim 1, wherein a controlled device is in contact with one of the two electrodes such that the sum of the thicknesses of the electrode and the controlled device is less than a predefined value E corresponding to the limiting distance between the second ferromagnetic layer and the controlled device, the value E being beyond which the controlled device can no longer induce magnetization reversal in the controlled device.

14. The control device of claim 1, wherein a controlled device spaced from one of the two electrodes is such that the controlled device is in contact with one of the two electrodes such that the sum of the thicknesses of the electrode and the controlled device is less than a predefined value E corresponding to the limiting distance between the second ferromagnetic layer and the controlled device, the value E being beyond which the controlled device can no longer induce magnetization reversal in the controlled device.

15. A device for controlling magnetization reversal of a ferromagnetic device without using an external magnetic field, comprising:
    at least two flat electrodes;
    a magnetic control part between said two flat electrodes including, starting from the first electrode, a first ferromagnetic layer, a non-magnetic layer, and a second ferromagnetic layer, and a second electrode, the thickness of said second ferromagnetic layer being less than that of said first layer, and the thickness of said second electrode being sufficiently small to enable magnetic coupling between said second ferromagnetic layer and a controlled ferromagnetic device controlled by the control device wherein said first and second ferromagnetic layer are entirely metallic and electrically conductive; and
    a controlled device in contact with one of the two electrodes such that the sum of the thicknesses of the electrode and the controlled device is less than a predefined value E corresponding to the limiting distance between the second ferromagnetic layer and the controlled device, the value E being beyond which the controlled device can no longer induce magnetization reversal in the controlled device.

* * * * *